(12) United States Patent
Andrle et al.

(10) Patent No.: US 7,903,763 B2
(45) Date of Patent: Mar. 8, 2011

(54) BANDWIDTH SELECTION FOR FM APPLICATIONS

(75) Inventors: Jiri Andrle, Prague (CS); Jan Ingerle, Prague (CS); Petr Kopecky, Prague (CS)

(73) Assignee: STMicroelectronics S.r.l., Agrate Brianza (IT)

( * ) Notice: Subject to any disclaimer, the term of this patent is extended or adjusted under 35 U.S.C. 154(b) by 967 days.

(21) Appl. No.: 11/701,164

(22) Filed: Jan. 31, 2007

(65) Prior Publication Data

US 2008/0181294 A1    Jul. 31, 2008

(51) Int. Cl.
    *H04L 27/00* (2006.01)
(52) U.S. Cl. .......................................... 375/324; 375/340
(58) Field of Classification Search .................. 375/316, 375/320, 324, 239, 322, 329, 334, 340
    See application file for complete search history.

(56) References Cited

U.S. PATENT DOCUMENTS

| | | | | | |
|---|---|---|---|---|---|
| 5,268,712 A | * | 12/1993 | Hilpert et al. | ................... | 725/68 |
| 5,319,625 A | * | 6/1994 | Okuda | ........................ | 369/53.44 |
| 5,359,367 A | * | 10/1994 | Stockill | .......................... | 725/137 |
| 5,521,944 A | * | 5/1996 | Hegeler et al. | ................. | 375/329 |
| 5,615,302 A | * | 3/1997 | McEachern | .................... | 704/209 |
| 5,995,565 A | * | 11/1999 | Tong et al. | ..................... | 375/346 |
| 6,643,503 B1 | * | 11/2003 | Phillips | ......................... | 455/340 |
| 2003/0008628 A1 | * | 1/2003 | Lindell et al. | .............. | 455/180.1 |
| 2003/0071683 A1 | * | 4/2003 | Shau | ............................. | 329/347 |
| 2010/0194623 A1 | * | 8/2010 | Hansen | .......................... | 342/52 |

\* cited by examiner

*Primary Examiner* — Emmanuel Bayard

(74) *Attorney, Agent, or Firm* — Lisa K. Jorgenson; Timothy L. Boller; Seed IP Law Group PLLC

(57) ABSTRACT

A system and method to optimize the quality of a modulated signal. In one aspect, an AM demodulator is used in conjunction with proper bandwidth selection of an FM signal. For example, the AM demodulator can be used to generate an instantaneous absolute value of the FM signal. The average value of the FM signal over a period of time is subtracted from the instantaneous absolute value in order to determine a variance in amplitude in the FM signal. In another aspect, several filters may be tested and the one having the lowest variance in amplitude may be used in order to select the filter having the desirable bandwidth.

42 Claims, 5 Drawing Sheets

BANDWIDTH SELECTION FOR FM APPLICATIONS

BACKGROUND OF THE INVENTION

1. Field of the Invention

The present disclosure relates to selecting bandwidth, and, particularly, to bandwidth selection of FM (frequency modulated) signals.

2. Description of the Related Art

FM bandwidth selection can be considered a compromise between over-demodulation distortion and interference caused by an adjacent channel and/or noise. Over-demodulation distortion is caused by a too restrictive band limitation of a desired channel. More particularly, a narrow bandwidth of the intermediate frequency (IF) filter in a receiver can cause distortion. The opposite situation appears in the case of adjacent channel distortion, low signal-to-noise ratio of a desired channel, or both. More particularly, a wider bandwidth of the IF filter may result in adjacent channel or noise leakage.

Adjacent channel power changes in time and makes IF filtration more difficult. Additionally, deviations from the desired FM channel also change in time. Thus, a fixed IF filtration bandwidth often cannot adaptively react in practice and will quickly succumb to distortion. To overcome this problem, high-performance receivers are equipped with chipsets allowing an adaptive IF filtration strategy. In adaptive filtering, the IF filtering is accomplished through a combination of a fixed filter and a filter selected from a filter bank. The selection is accomplished through an external microcontroller that monitors the incoming signals and chooses one of the filters based on signal quality. In this way, changes in adjacent channel power or deviations from the desired channel can be tracked and corrected.

While adaptive filtering has numerous advantages, there are still problems not resolved in the prior art. Some prior art solutions tend to chose a narrow band and diverge in special field conditions. Other solutions are based on a state machine that evaluates field conditions according to a tentatively defined schema. However, if there is a situation not defined in the schema, the state machine cannot properly react. Still other solutions do not distinguish between adjacent channel interference and over-deviated signals in strong adjacent channel conditions.

Therefore, it would be desirable to have an FM receiver that can automatically adjust the IF (intermediate frequency) bandwidth according to signal reception conditions without having the drawbacks of the prior art.

BRIEF SUMMARY OF THE INVENTION

Embodiments of a system and method are disclosed to optimize the quality of FM signals.

In one aspect, an AM demodulator is used in conjunction with proper bandwidth selection of an FM signal in order to monitor any distortion and correctively adapt the filter strategy. For example, the AM demodulator can be used to generate an instantaneous absolute value of the FM signal. The average value of the FM signal over a period of time is subtracted from the instantaneous absolute value in order to determine a variance in amplitude in the FM signal. Automatic bandwidth selection can then be made based on the variance in amplitude in order to optimize the FM signal quality.

In another aspect, several filters may be tested and the one having the lowest variance in amplitude may be used in order to automatically select the filter having the desirable bandwidth.

In yet another aspect, a condition analysis circuit may ensure that in certain field conditions, a predetermined filter is chosen rather than basing the filter selection on the lowest variance.

In one aspect, a method for selecting bandwidth of a frequency-modulated signal, comprises: receiving the frequency-modulated signal; demodulating the frequency-modulated signal using an amplitude demodulator to generate an absolute value of the frequency-modulated signal; and selecting a bandwidth of the frequency-modulated signal based on the absolute value of the frequency-modulated signal obtained from the amplitude demodulator. In one embodiment, selecting further includes subtracting an average value of the frequency-modulated signal, over a period of time, from the absolute value of the frequency-modulated signal. In one embodiment, the absolute value of the frequency-modulated signal includes an instantaneous absolute value of both real and imaginary parts of the frequency-modulated signal. In one embodiment, selecting the proper bandwidth includes selecting a low-pass filter from a set of low-pass filters. In one embodiment, selecting further includes passing the frequency-modulated signal through a set of filters and choosing a filter that produces a lowest variance of amplitude in the filtered frequency-modulated signal. In one embodiment, the method further includes passing the frequency-modulated signal through a plurality of low-pass filters; and determining which low-pass filter creates a lowest variance of amplitude in the frequency-modulated signal using the absolute value, wherein selecting includes switching the frequency-modulated signal to pass through the low-pass filter with the lowest variance in amplitude. In one embodiment, selecting includes switching the frequency-modulated signal to pass through a filter that results in a lowest variance in amplitude and demodulating the filtered signal using a frequency demodulator. In one embodiment, the method further includes analyzing conditions of the frequency-modulated signal and selecting includes selecting the filter based on the analysis and demodulating the filtered signal using a frequency demodulator.

In one aspect, a system for selecting bandwidth of a frequency-modulated signal comprises: a set of filters; an amplitude demodulator coupled to the set of filters; a subtractor coupled to the amplitude demodulator to subtract an average value of the frequency-modulated signal from an output of the amplitude demodulator; and a filter selector coupled to the subtractor and the set of filters to select one of the filters in the set. In one embodiment, the system further includes a frequency demodulator coupled between the set of filters and a speaker. In one embodiment, the system further includes a switch coupled to the set of filters to switch the frequency-modulated signal to each of a plurality of filters in the set in order to determine which filter provides a minimum variation in an average amplitude of the frequency-modulated signal. In one embodiment, the system further includes a plurality of amplitude demodulators and subtractors in parallel and coupled between the filter selector and the set of filters. In one embodiment, the system further includes an antenna for receiving the frequency-modulated signal and a tuner coupled between the antenna and the set of filters. In one embodiment, the system further includes a tuner coupled upstream of the set of filters, an amplitude/frequency demodulator coupled to an output of the tuner, and a condition analyzer coupled between the filter selector and the amplitude/frequency demodulator. In one embodiment, the set of filters are a first set of low-pass filters to test the optimal bandwidth of the frequency-modulated signal, and the system further includes a second set of low-pass filters used to produce an audio signal. In one embodiment, the system further includes a table generator coupled between the amplitude demodulator and the filter selector to generate a table indicative of the quality of the frequency-modulated signal after passing through respective filters in the set of low-pass filters. In one embodiment, each filter in the set of low-pass filters has a different cut-off frequency so as to test which cut-off frequency is an optimal one for the frequency-modulated signal.

In one aspect, a method of selecting a filter for processing of an frequency-modulated signal comprises: passing the frequency-modulated signal through a plurality of low-pass filters; identifying a low-pass filter associated with a minimum variation in an average amplitude of the frequency-modulated signal; and processing an output of the identified low-pass filter to produce a sound associated with the frequency-modulated signal. In one embodiment, identifying includes: generating an absolute value of an output signal of each of the low-pass filters in the plurality of low-pass filters; and subtracting an average constant value of the frequency-modulated signal from each of the generated absolute values to obtain a variation in an average amplitude for each of the low-pass filters in the plurality of low-pass filters. In one embodiment, the method further includes generating a table including the variation in the average amplitude for each low-pass filter in the plurality of low-pass filters, wherein identifying includes comparing values in the table and the identified low-pass filter is associated with the lowest value. In one embodiment, the identified low-pass filter is one of the filters in the plurality of low-pass filters.

In one aspect, a system for selecting bandwidth comprises means for filtering a frequency-modulated signal; means for generating an absolute value of the filtered frequency-modulated signal; means for generating a variation of amplitude of the frequency-modulated signal using the generated absolute value; and means for selecting a filter associated with bandwidth based on the generated variation in amplitude. In one embodiment, the means for filtering comprises a low-pass filter. In one embodiment, the means for generating an absolute value comprises an amplitude demodulator.

In one aspect, a method of demodulating a modulated signal comprises: applying the modulated signal to a first plurality of filters, producing a first plurality of filtered signals; generating a variation of average amplitude for each of the filtered signals in the first plurality of filtered signals; and selecting a demodulation bandwidth based on the generated variations of average amplitude. In one embodiment, selecting a demodulation bandwidth comprises identifying a filter in the first plurality of filters based on the generated variations and the method further comprises demodulating the filtered signal produced by the identified filter. In one embodiment, the modulated signal is a frequency-modulated signal. In one embodiment, the modulated signal is a phase-modulated signal. In one embodiment, selecting a demodulation bandwidth comprises selecting a filter in a second plurality of filters based on the generated variations and the method further comprises applying the modulated signal to the selected filter in the second plurality of filters and demodulating an output of the selected filter. In one embodiment, the signal is a frequency-modulated signal. In one embodiment, generating the variation of average amplitude for a particular filtered signal in the first plurality of filtered signals comprises: generating an absolute value of the particular filtered signal; generating an average value of the particular filtered signal; and generating a difference between the absolute value and the average value. In one embodiment, the method further comprises: analyzing a signal condition, wherein selecting the demodulation bandwidth comprises identifying a filter in the first plurality of filters based on the analysis and the generated variations of average amplitude; and demodulating the filtered signal produced by the identified filter in the first plurality of filters. In one embodiment, the method further comprises: analyzing a signal condition, wherein selecting the demodulation bandwidth comprises selecting a filter in a second plurality of filters based on the analysis of the signal condition and the generated variations; applying the modulated signal to the selected filter in the second plurality of filters; and demodulating an output of the selected filter in the second plurality of filters.

In one aspect, a system for demodulating a modulated signal comprises: a first filter bank having an input configured to receive the modulated signal; a filter-tester configured to generate a plurality of variations from an average amplitude associated with respective filters in the first filter bank; a filter-selector coupled to an output of the filter tester and configured to select a filter in the first filter bank; and a first demodulator coupled to the first filter bank and configured to demodulate an output signal of the selected filter in the first filter bank. In one embodiment, the first filter bank comprises a plurality of low-pass filters. In one embodiment, the first filter bank comprises a plurality of band-pass filters. In one embodiment, the filter-tester comprises: an amplitude demodulator; and a subtractor. In one embodiment, the filter-tester comprises: a second bank of filters; an amplitude demodulator; and a subtractor. In one embodiment, the filter-tester comprises: a plurality of amplitude demodulators; and a plurality of subtractors coupled to respective amplitude demodulators in the plurality of amplitude demodulators. In one embodiment, the system further comprises: a second demodulator configured to receive the modulated signal; and a signal-condition analyzer coupled to the second demodulator and having an output coupled to the filter-selector. In one embodiment, the first demodulator comprises a frequency demodulator. In one embodiment, the first demodulator comprises a phase demodulator.

These features and others of embodiments will be more readily apparent from the following detailed description of embodiments, which proceeds with reference to the accompanying drawings.

DETAILED DESCRIPTION OF THE INVENTION

Figure 1:
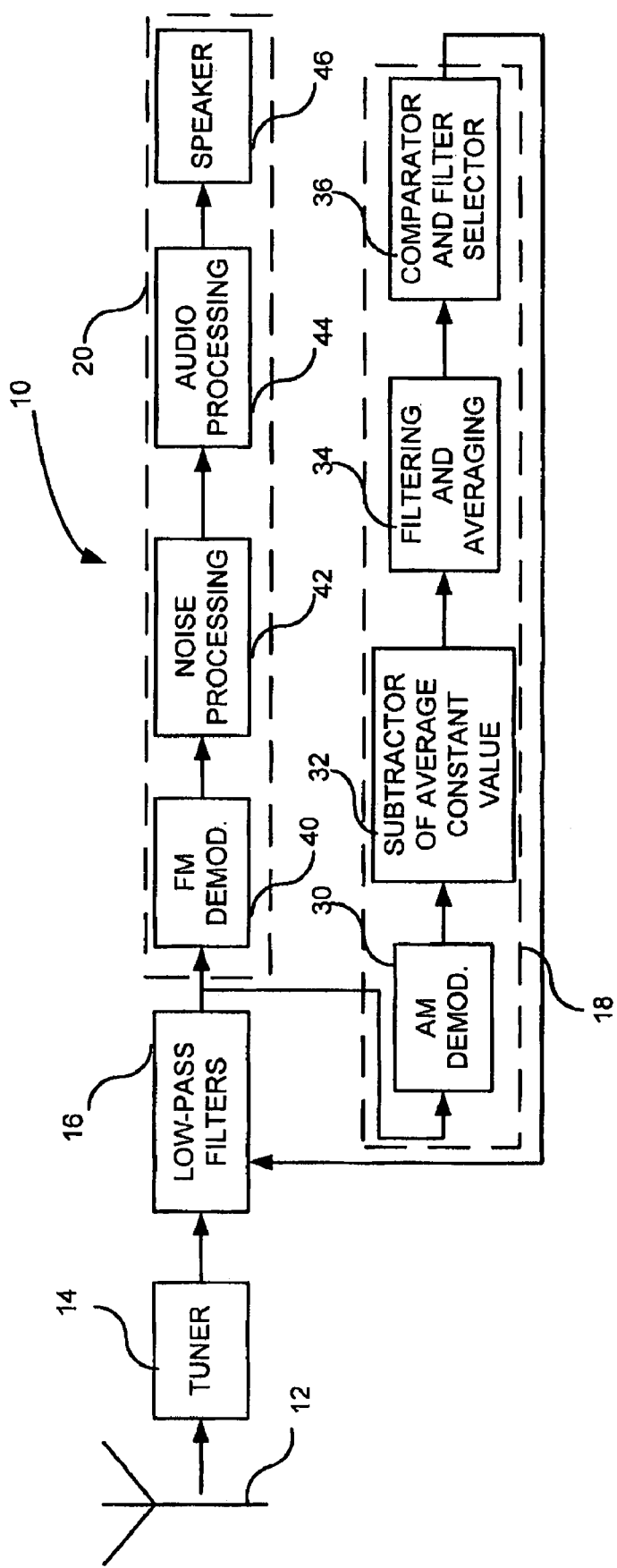
FIG. 1 is a circuit diagram of a system for automatic selection of a filter with a desired bandwidth.

FIG. 1 shows a system 10 for automatic bandwidth selection. The system 10 may be used in a variety of applications. FIG. 1 shows an example of a particular application wherein the FM signal is received on an antenna 12. The FM signal is passed to a tuner 14 that performs base band demodulation of the FM signal. One or more filters from a set of low-pass filters 16 are coupled to the tuner 14 and are then used to filter undesired noise and define the desired bandwidth.

Downstream from the set of low-pass filters 16, there are two main sections of the circuit operating in parallel: the test-and-selection portion 18 and the processing-and-output portion 20. The test-and-selection portion 18 is used to analyze various filters from the set of filters 16 and automatically determine in real time which filter provides the best quality signal. As part of the determination process, an AM demodulator 30 coupled to the set of filters 16 generates an instantaneous absolute value of the FM signal. The absolute value of the signal is then passed to a subtractor circuit 32 coupled to the AM demodulator 30. The subtractor circuit 32 first determines an average constant value of the FM signal over a predetermined period of time and then subtracts the average constant value from the instantaneous absolute value that was determined by the AM demodulator 30. The result is a variance of the amplitude in the FM signal. The average value calculated by the subtractor circuit 32 is estimated by a first order IIR filter and the predetermined period of time varies depending on the application (e.g., 3 ms). Any deviation from the average FM signal may be considered noise, which is not desirable. A filtering and averaging circuit 34 does some processing and computes an average of the variance in amplitude. This averaging may also be performed by a first order IIR filter. The period of time over which this averaging is performed varies on the application, but in one example it was set to 45 ms. In any event, it is generally desirable that the period of time for calculating the average in circuit 34 is longer than in circuit 32. The results may be stored in a table (not shown) within the filtering and averaging circuit 34. As explained more fully below, other values representing variances in amplitudes for other low-pass filters within the set 16 are also stored in the table so that the table has a correspondence between each filter used and the variance in amplitude of the FM signal for that filter. A comparator and filter selector 36 compares the values stored in the table and determines the lowest value. The lowest value represents the least deviation from the true FM signal and, consequently, the highest quality signal with the least noise. Based on this determination, the associated filter within the set of filters 16 is chosen by the comparator and filter selector 36 through a feedback signal path coupling the comparator and filter selector 36 to the low-pass filter 16.

The processing-and-output portion 20 provides the audio output to the user. An FM demodulator 40 receives the FM signal from the selected low-pass filter 16 and outputs a phase-modulated signal that is further processed to remove noise in processing circuit 42. An audio processing circuit 44 coupled to the noise processing circuit 42 prepares and amplifies the signal sent to a speaker 46 that provides the corresponding sound to the user with high quality.

Figure 2:
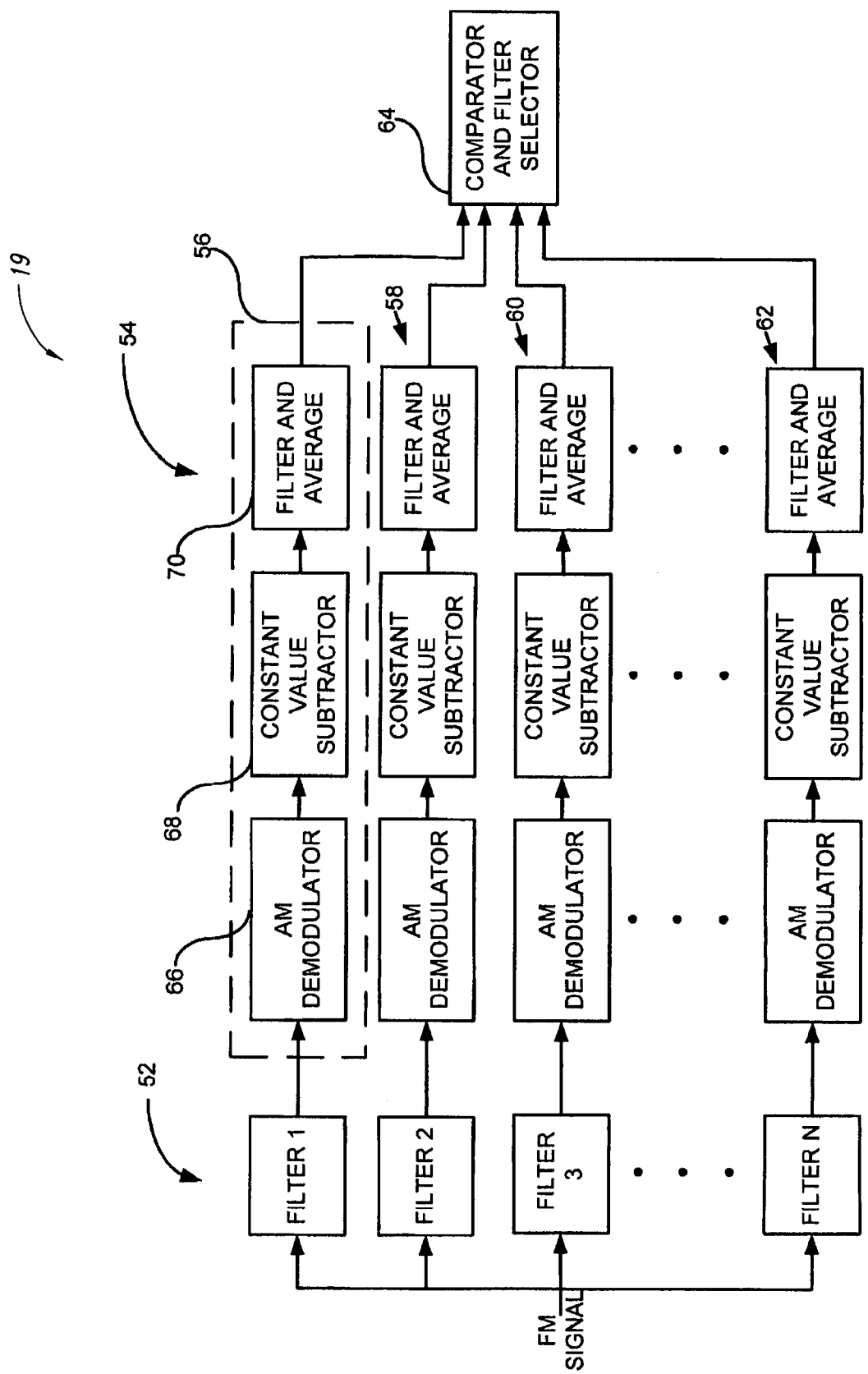
FIG. 2 is a detailed circuit diagram showing a test and selection part of an embodiment of the system of FIG. 1.

FIG. 2 shows further details of an embodiment of a test-and-selection module 19 suitable for use in the embodiment of FIG. 1. An FM signal is received into a set of filters 52. The FM signal may be received from a tuner, as described in FIG. 1, or received by other means. The set of filters 52 is shown as including N filters in parallel and numbered sequentially, where N is any number. The filters are used to control the bandwidth of the FM signal and may be band pass filters or low-pass filters (where the signal was demodulated to the base band). Generally, the more filters used, the more accurate the circuit can control the bandwidth to produce a high-quality signal. However, more filters can result in more frequent switching that can also cause output distortion. One possible application includes low-pass filters with incrementing cut-off frequencies so that filter 1 has a cut-off frequency of 30 KHz, filter 2 has a cut-off frequency of 40 KHz, filter 3 has a cut-off frequency of 50 KHz, and the remaining filters have the following sequence 60, 70, 80, 90, 100, 110, 165 KHz. Of course, this is a simple example and any desired filter sequence may be used.

Each filter in the set 52 has an associated test portion, shown generally at 54, downstream from the filter. For example, filter 1 has a test portion 56, filter 2 has a test portion 58, filter 3 has a test portion 60, and filter N has a test portion 62. Each of the test portions 54 are in parallel and provide an output to a shared comparator and filter selector circuit 64. Each test portion 54 has the same structure so only test portion 56 is described for simplicity. Test portion 56 includes an AM demodulator 66 coupled to the filter 1. The AM demodulator 66 provides an instantaneous absolute value of the FM signal. The output of the AM demodulator 66 is passed to a constant value subtractor 68, which removes an average constant value of the FM signal to produce a variance in the instantaneous absolute value. The output of the constant value subtractor 68 is passed to a filter and average circuit 70 that calculates and stores the average variance. The comparator and filter selector 64 then collects the stored variance from each test portion 54, chooses the lowest variance, and selects the low-pass filter from the set 52 that produces a signal with the lowest variance. As previously described in relation to FIG. 1, the selected filter is then used to pass the FM signal onto the processing and output portion 20 of a circuit, so that it may be heard on a speaker or otherwise used.

Figure 3:
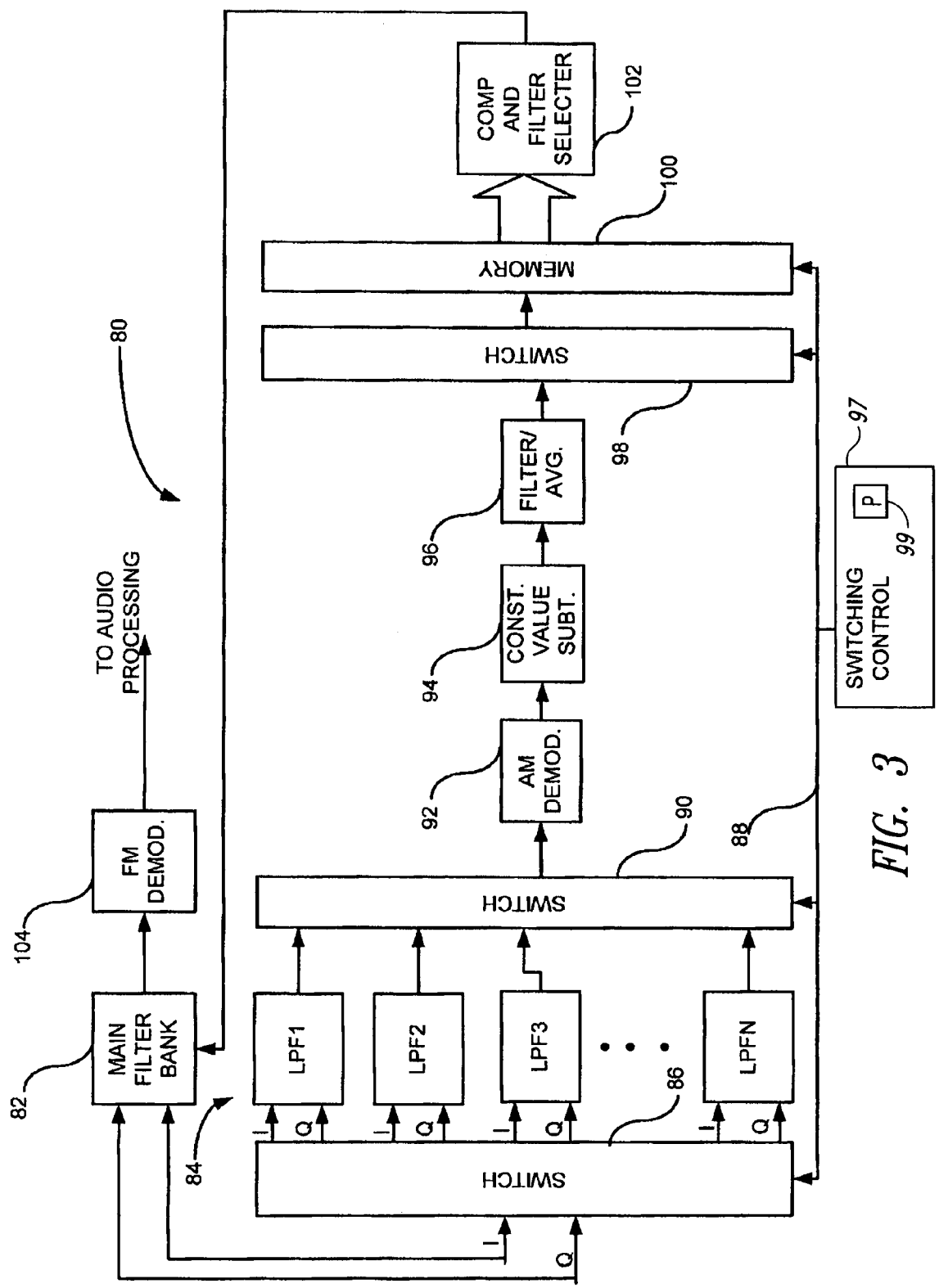
FIG. 3 is a detailed circuit diagram of another embodiment showing the test and selection part of the system of FIG. 1.

FIG. 3 shows another embodiment of a system 80 used to automatically select a filter associated with the proper bandwidth of an FM signal. In this case, two separate filter banks are shown: a main filter bank 82 and a testing filter bank 84. The test filter bank 84 has filters that correspond to filters in the main filter bank 82, so that the test filter bank 84 may be used to evaluate a likely response of the main filter bank 82. For example, both filter banks 82, 84 may contain an identical set of filters including the same cut-off frequencies. For example, filter 1 in the main filter bank 82 is identical to filter 1 in the test bank 84, etc. The incoming FM signal is shown as having real and imaginary parts (Q & I) that are supplied to a switch 86. The switch 86 has an associated control line 88 that may be coupled to a controller 97, which may comprise a processor 99 and/or a counter (not shown). The switch 86 switches the real and imaginary parts of the FM signal to each of the filters in the test filter bank 84, one filter at a time. A second switch 90, also controlled by the same control line 88, couples the current filter 84 being tested to an AM demodulator 92 that produces an absolute value of the FM signal. A constant value subtractor 94 coupled to the AM demodulator 92 then calculates the variance component of the FM signal. The FM signal is then filtered and averaged by a circuit shown at 96 that is coupled to the output of the constant value subtractor 94. A switch 98 coupled to the output of the circuit 96 allows the result of the current filter being tested to be stored in a memory 100. The period of time for switching to the next filter depends on the time constant set in the filter/averaging circuit 96. Once all of the filters in the test bank 84 have been tested, the comparator and filter selector circuit 102 reads each of the stored memory values (one per filter) and selects the filter having the least variance component of the FM signal. The corresponding filter in the main filter bank 82 is then selected through an output connecting the comparator and filter selector circuit 102 to the main filter bank 82. The FM signal passes through the main filter bank 82 that controls the bandwidth of the FM signal and passes the filtered signal to an FM demodulator 104. The output of the FM demodulator then passes the signal onto further audio processing.

Figure 4:
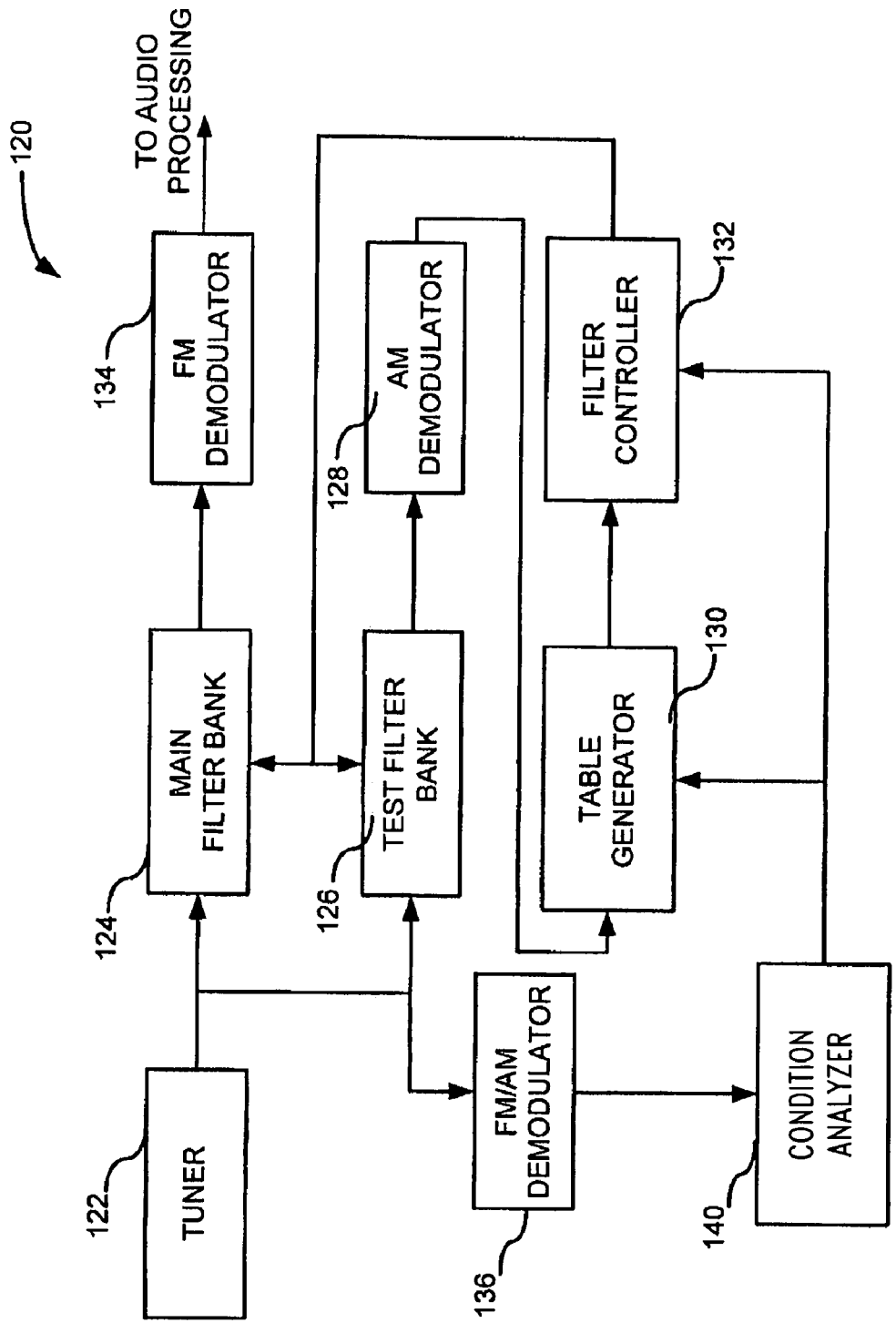
FIG. 4 is another embodiment of a system for automatic selection of a filter with the desired bandwidth.

FIG. 4 represents another embodiment of a system 120 for selecting bandwidth. A tuner 122 provides an FM signal for which a bandwidth needs to be determined. Two separate filter banks are coupled in parallel to the output of the tuner 122: a main filter bank 124 and a test filter bank 126. The test filter bank 126 is coupled to an AM demodulator 128 that creates an absolute value of the FM signal. The AM demodulator 128 may include multiple AM demodulators coupled in parallel as described in FIG. 2 or switches together with a single AM demodulator as described in FIG. 3. In any event, the output of the AM demodulator 128, which is an absolute value of the FM signal, is passed to a table generator 130 that includes a subtractor and averaging circuits as previously described. A table produced by the table generator 130 is read by a filter controller 132 that selects the desired filter in the main filter bank 124 in a manner already described. The output of the main filter bank 124 is passed to an FM demodulator 134 that demodulates the signal and passes the signal onward for further audio processing.

The embodiment of FIG. 4 also includes an FM/AM demodulator 136 coupled to the output of the tuner 122. The FM/AM demodulator 136 passes both an absolute value of the FM signal and a phase demodulated FM signal to a condition analyzer 140. The condition analyzer 140 is coupled to the filter controller 132 and includes additional intelligence to ensure that the filter controller 132 does not switch sporadically because of noise or other minor fluctuations. For example, if there is a condition of bad reception, it is generally advisable to choose the narrowest filter rather than making a decision based on an output from the table generator 130. Thus, the condition analysis circuit 140 can analyze the conditions based on the output of the FM/AM demodulator 136 and provide further control to the filter controller circuit 132.

Figure 5:
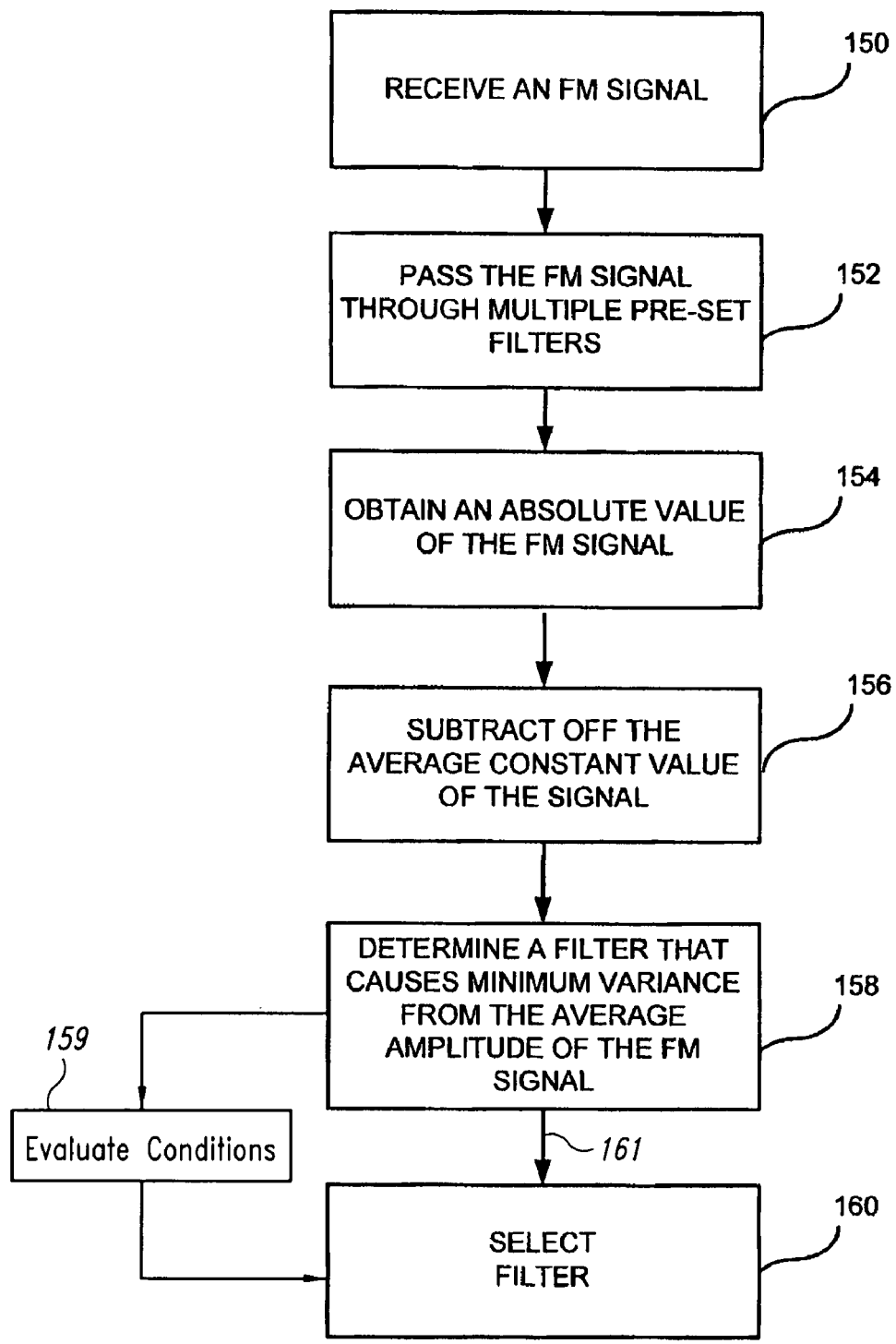
FIG. 5 is a flowchart of a method for selecting a filter with the desired bandwidth.

FIG. 5 is a flowchart of a method for selecting a bandwidth for an FM signal. In process block 150, the FM signal is received. The FM signal may be received by any means, such as an antenna, cable, etc. In process block 152, the FM signal is passed through multiple pre-set filters. For example, the FM signal may be passed through a filter bank having filters in parallel of varying cut-off frequencies. Such filters are used for testing which filter provides the least noise under the current conditions. In process block 154, an absolute value of the FM signal is obtained. This may, for example, be obtained by using an AM demodulator. Other forms of obtaining an absolute value may also be used. For example, an absolute value may be obtained by the simple equation:

$$|FM|=\sqrt{I^2+Q^2}$$

so any circuit can be used to obtain the absolute value if it produces an output consistent with this equation. In process block 156, an average value of the FM signal is subtracted from the absolute value. Process blocks 154 and 156 may be repeated for each filter being tested. In process block 158, a determination is made which filter results in the minimum difference between the absolute value determined in process block 154 and the average value obtained in process block 156. In process block 159, a condition or conditions of the signal are evaluated, for example, as discussed above in the description of FIG. 4. In process block 160, a filter is selected based on the determination and the evaluation of the signal conditions. In some embodiments, the evaluation of the condition in process block 159 may be omitted, as illustrated by line 161. In these embodiments, the determined filter may be selected as the filter having the best bandwidth for the FM signal.

In one embodiment, a computer readable memory medium (see memory 100 of FIG. 3) contains instructions for causing a processor (see processor 99 of FIG. 3) to perform a method for selecting bandwidth of a frequency-modulated signal, comprising: receiving the frequency-modulated signal; demodulating the frequency-modulated signal using an amplitude demodulator to generate an absolute value of the frequency-modulated signal; and selecting a bandwidth of the frequency-modulated signal based on the absolute value of the frequency-modulated signal obtained from the amplitude demodulator. In one embodiment, a computer readable memory medium (see memory 100 of FIG. 3) contains instructions for causing a processor (see processor 99 of FIG. 3) to perform a method comprising: applying the modulated signal to a first plurality of filters, producing a first plurality of filtered signals; generating a variation of average amplitude for each of the filtered signals in the first plurality of filtered signals; and selecting a demodulation bandwidth based on the generated variations of average amplitude.

Having illustrated and described the principles of the invention in a preferred embodiment, it should be apparent to those skilled in the art that the embodiment can be modified in arrangement and detail without departing from such principles.

For example, although some embodiments include two separate filter banks, one for test and one for producing the final version of the signal, such embodiments can easily be converted to have only one filter bank with a switch so that the same filter that is tested is also used for audio processing.

Additionally, the circuits described herein may be used in FM radio applications and applications other than FM radio. For example, the system described herein can be used on applications having a phase-modulated signal with a constant amplitude. One example is MPSK modulation used in digital communication.

Furthermore, low-pass filters described herein can easily be modified to be band pass filters if the tuner does not demodulate the FM signal to the base band.

Still further, the system described herein can be used with any demodulated signal, and is not necessarily limited to FM signals.

In view of the many possible embodiments to which the principles or invention may be applied, it should be recognized that the illustrated embodiments are only preferred examples of the invention and should not be taken as a limitation on the scope of the invention. Rather, the invention is defined by the following claims. We therefore claim as the invention all such embodiments that come within the scope of these claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims

We claim:

1. A method for selecting bandwidth of a frequency-modulated signal, comprising:
receiving the frequency-modulated signal;
demodulating the frequency-modulated signal using an amplitude demodulator to generate an absolute value of the frequency-modulated signal; and selecting a bandwidth of the frequency-modulated signal based on the absolute value of the frequency-modulated signal obtained from the amplitude demodulator, wherein the selecting includes subtracting an average value of the frequency-modulated signal, over a period of time, from the absolute value of the frequency-modulated signal.

2. The method of claim 1 wherein the absolute value of the frequency-modulated signal includes an instantaneous absolute value of both real and imaginary parts of the frequency-modulated signal.

3. The method of claim 1 wherein selecting the proper bandwidth includes selecting a low-pass filter from a set of low-pass filters.

4. The method of claim 1 wherein selecting further includes passing the frequency-modulated signal through a set of filters and choosing a filter that produces a lowest variance of amplitude in the filtered frequency-modulated signal.

5. The method of claim 1, further including:
passing the frequency-modulated signal through a plurality of low-pass filters; and
determining which low-pass filter creates a lowest variance of amplitude in the frequency-modulated signal using the absolute value, wherein selecting includes switching the frequency-modulated signal to pass through the low-pass filter with the lowest variance in amplitude.

6. The method of claim 1, wherein selecting includes switching the frequency-modulated signal to pass through a filter that results in a lowest variance in amplitude and the method further includes demodulating the filtered signal using a frequency demodulator.

7. The method of claim 1, further including analyzing conditions of the frequency-modulated signal and wherein selecting includes selecting a filter based on the analysis and demodulating the filtered signal using a frequency demodulator.

8. A system for selecting bandwidth of a frequency-modulated signal, comprising:
a set of filters;
an amplitude demodulator coupled to the set of filters;
a subtractor coupled to the amplitude demodulator to subtract an average value of the frequency-modulated signal from an output of the amplitude demodulator; and
a filter selector coupled to the subtractor and the set of filters to select one of the filters in the set.

9. The system of claim 8, further including a frequency demodulator coupled between the set of filters and a speaker.

10. The system of claim 8, further including a switch coupled to the set of filters to switch the frequency-modulated signal to each of a plurality of filters in the set in order to determine which filter provides a minimum variation in an average amplitude of the frequency-modulated signal.

11. The system of claim 8, further including a plurality of amplitude demodulators and subtractors in parallel and coupled between the filter selector and the set of filters.

12. The system of claim 8, further including an antenna for receiving the frequency-modulated signal and a tuner coupled between the antenna and the set of filters.

13. The system of claim 8, further including a tuner coupled upstream of the set of filters, an amplitude/frequency demodulator coupled to an output of the tuner, and a condition analyzer coupled between the filter selector and the amplitude/frequency demodulator.

14. The system of claim 8, wherein the set of filters are a first set of low-pass filters to test the optimal bandwidth of the frequency-modulated signal, and further including a second set of low-pass filters used to produce an audio signal.

15. The system of claim 8, further including a table generator coupled between the amplitude demodulator and the filter selector to generate a table indicative of the quality of the frequency-modulated signal after passing through respective filters in the set of filters, wherein the set of filters is a set of low-pass filters.

16. The system of claim 8, wherein the set of filters is a set of low-pass filters and each filter in the set of low-pass filters has a different cut-off frequency so as to test which cut-off frequency is an optimal one for the frequency-modulated signal.

17. A method of selecting a filter for processing of an frequency-modulated signal, comprising:
passing the frequency-modulated signal through a plurality of low-pass filters;
identifying a low-pass filter associated with a minimum variation in an average amplitude of the frequency-modulated signal; and
processing an output of the identified low-pass filter to produce a sound associated with the frequency-modulated signal.

18. The method of claim 17, wherein identifying includes:
generating an absolute value of an output signal of each of the low-pass filters in the plurality of low-pass filters; and
subtracting an average constant value of the frequency-modulated signal from each of the generated absolute values to obtain a variation in an average amplitude for each of the low-pass filters in the plurality of low-pass filters.

19. The method of claim 18, further including generating a table including the variation in the average amplitude for each low-pass filter in the plurality of low-pass filters, wherein identifying includes comparing values in the table and the identified low-pass filter is associated with a lowest value.

20. The method of claim 17 wherein the identified low-pass filter is one of the filters in the plurality of low-pass filters.

21. A system for selecting bandwidth comprising:
means for filtering a frequency-modulated signal;
means for generating an absolute value of the filtered frequency-modulated signal;
means for generating a variation of amplitude of the frequency-modulated signal using the generated absolute value; and
means for selecting a filter associated with bandwidth based on the generated variation in amplitude.

22. The system of claim 21 wherein the means for filtering comprises a low-pass filter.

23. The system of claim 21 wherein the means for generating an absolute value comprises an amplitude demodulator.

24. A method of demodulating a modulated signal, comprising:
applying the modulated signal to a first plurality of filters, producing a first plurality of filtered signals;
generating a variation of average amplitude for each of the filtered signals in the first plurality of filtered signals; and
selecting a demodulation bandwidth based on the generated variations of average amplitude.

25. The method of claim 24 wherein selecting a demodulation bandwidth comprises identifying a filter in the first plurality of filters based on the generated variations and the method further comprises demodulating the filtered signal produced by the identified filter.

26. The method of claim 25 wherein the modulated signal is a frequency-modulated signal.

27. The method of claim 25 wherein the modulated signal is a phase-modulated signal.

28. The method of claim 24 where the first plurality of filters comprises a plurality of low-pass filters.

29. A method of demodulating a modulated signal, comprising:
applying the modulated signal to a first plurality of filters, producing a first plurality of filtered signals;
generating a variation of average amplitude for each of the filtered signals in the first plurality of filtered signals; and
selecting a demodulation bandwidth based on the generated variations of average amplitude, wherein selecting a demodulation bandwidth comprises selecting a filter in a second plurality of filters based on the generated variations and the method further comprises applying the modulated signal to the selected filter in the second plurality of filters and demodulating an output of the selected filter.

30. The method of claim 29 wherein the signal is a frequency-modulated signal.

31. A method of demodulating a modulated signal, comprising:
applying the modulated signal to a first plurality of filters, producing a first plurality of filtered signals;
generating a variation of average amplitude for each of the filtered signals in the first plurality of filtered signals; and
selecting a demodulation bandwidth based on the generated variations of average amplitude, wherein the generating the variation of average amplitude for a particular filtered signal in the first plurality of filtered signals comprises:
generating an absolute value of the particular filtered signal;
generating an average value of the particular filtered signal; and
generating a difference between the absolute value and the average value.

32. A method of demodulating a modulated signal, comprising:
applying the modulated signal to a first plurality of filters, producing a first plurality of filtered signals;
generating a variation of average amplitude for each of the filtered signals in the first plurality of filtered signals;
selecting a demodulation bandwidth based on the generated variations of average amplitude;
analyzing a signal condition, wherein selecting the demodulation bandwidth comprises identifying a filter in the first plurality of filters based on the analysis and the generated variations of average amplitude; and
demodulating the filtered signal produced by the identified filter in the first plurality of filters.

33. A method of demodulating a modulated signal, comprising:
applying the modulated signal to a first plurality of filters, producing a first plurality of filtered signals;
generating a variation of average amplitude for each of the filtered signals in the first plurality of filtered signals;
selecting a demodulation bandwidth based on the generated variations of average amplitude;
analyzing a signal condition, wherein selecting the demodulation bandwidth comprises selecting a filter in a second plurality of filters based on the analysis of the signal condition and the generated variations;
applying the modulated signal to the selected filter in the second plurality of filters; and
demodulating an output of the selected filter in the second plurality of filters.

34. A system for demodulating a modulated signal, comprising:
a first filter bank having an input configured to receive the modulated signal;
a filter-tester configured to generate a plurality of variations from an average amplitude associated with respective filters in the first filter bank;
a filter-selector coupled to an output of the filter tester and configured to select a filter in the first filter bank; and
a first demodulator coupled to the first filter bank and configured to demodulate an output signal of the selected filter in the first filter bank.

35. The system of claim 34 wherein the first filter bank comprises a plurality of low-pass filters.

36. The system of claim 34 wherein the first filter bank comprises a plurality of band-pass filters.

37. The system of claim 34 wherein the filter-tester comprises:
an amplitude demodulator; and
a subtractor.

38. The system of claim 34 wherein the filter-tester comprises:
a second bank of filters;
an amplitude demodulator; and
a subtractor.

39. The system of claim 34 wherein the filter-tester comprises:
a plurality of amplitude demodulators; and
a plurality of subtractors coupled to respective amplitude demodulators in the plurality of amplitude demodulators.

40. The system of claim 34 further comprising:
a second demodulator configured to receive the modulated signal; and
a signal-condition analyzer coupled to the second demodulator and having an output coupled to the filter-selector.

41. The system of claim 34 wherein the first demodulator comprises a frequency demodulator.

42. The system of claim 34 wherein the first demodulator comprises a phase demodulator.

* * * * *

UNITED STATES PATENT AND TRADEMARK OFFICE
CERTIFICATE OF CORRECTION

PATENT NO.        : 7,903,763 B2
APPLICATION NO.   : 11/701164
DATED             : March 8, 2011
INVENTOR(S)       : Jiri Andrle et al.

It is certified that error appears in the above-identified patent and that said Letters Patent is hereby corrected as shown below:

Title Page;
Item 73
"STMicroelectronics S.r.l., Agrate Brianza (IT)" should read as, --STMicroelectronics Design and Application S.R.O., Prague (CS)--.

Signed and Sealed this
Second Day of August, 2011

David J. Kappos
*Director of the United States Patent and Trademark Office*